(12) United States Patent
Morii

(10) Patent No.: US 10,587,113 B2
(45) Date of Patent: Mar. 10, 2020

(54) ELECTRONIC DEVICE AND METHOD OF CONTROLLING THE SAME

(71) Applicant: CANON KABUSHIKI KAISHA, Tokyo (JP)

(72) Inventor: Takashi Morii, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 264 days.

(21) Appl. No.: 15/686,322

(22) Filed: Aug. 25, 2017

(65) Prior Publication Data

US 2018/0069395 A1    Mar. 8, 2018

(30) Foreign Application Priority Data

Sep. 5, 2016  (JP) .................................. 2016-173124

(51) Int. Cl.
| | | |
|---|---|---|
| H02H 9/02 | (2006.01) | |
| G06F 1/28 | (2006.01) | |
| G06F 1/26 | (2006.01) | |
| H02J 7/00 | (2006.01) | |
| H01B 7/36 | (2006.01) | |
| H02J 5/00 | (2016.01) | |
| G01R 31/42 | (2006.01) | |

(52) U.S. Cl.
CPC .............. *H02H 9/02* (2013.01); *G06F 1/263* (2013.01); *G06F 1/266* (2013.01); *G06F 1/28* (2013.01); *H01B 7/36* (2013.01); *H02J 5/00* (2013.01); *H02J 7/0068* (2013.01); *G01R 31/42* (2013.01); *H02J 2007/0062* (2013.01)

(58) Field of Classification Search
CPC .. H02H 9/02; H02J 7/0068; H02J 5/00; H02J 2007/0062; G06F 1/28; G06F 1/263; G06F 1/266; H01B 7/36; G01R 31/42
See application file for complete search history.

(56) References Cited

U.S. PATENT DOCUMENTS

| | | | | |
|---|---|---|---|---|
| 6,576,833 | B2 * | 6/2003 | Covaro ................ | H01R 31/065 174/359 |
| 6,963,933 | B2 * | 11/2005 | Saito ....................... | G06F 1/263 710/1 |
| 8,736,227 | B2 * | 5/2014 | Chadbourne ........... | G06F 1/266 320/107 |
| 9,129,065 | B2 * | 9/2015 | Hang .................... | G06F 13/385 |
| 9,400,546 | B1 * | 7/2016 | Agarwal ................ | G06F 1/266 |
| 9,529,411 | B2 * | 12/2016 | Waters .................. | G06F 1/3287 |
| 9,652,351 | B2 * | 5/2017 | Srivastava .......... | G06F 11/3051 |
| 9,811,135 | B2 * | 11/2017 | Agarwal ................ | G06F 1/263 |
| 10,346,333 | B2 * | 7/2019 | Wood, III ........... | G06F 13/4282 |

(Continued)

FOREIGN PATENT DOCUMENTS

JP    H06-141476 A    5/1994

*Primary Examiner* — Pinping Sun
(74) *Attorney, Agent, or Firm* — Cowan, Liebowitz & Latman, P.C.

(57) ABSTRACT

An electronic device receives external power from an external device when connected to the external device via a cable. The electronic device detects the power supply capability of the external device, determines whether the cable is a predetermined type of cable, and sets a current value limit for the external power based on the detected power supply capability of the external device and on the result of determining whether the cable is the predetermined type of cable.

16 Claims, 7 Drawing Sheets

(56) References Cited

U.S. PATENT DOCUMENTS

| | | | |
|---|---|---|---|
| 2002/0169915 A1* | 11/2002 | Wu | G06F 13/4081 |
| | | | 710/305 |
| 2008/0183909 A1* | 7/2008 | Lim | G06F 13/4081 |
| | | | 710/14 |
| 2011/0221604 A1* | 9/2011 | Johnson | G06F 1/266 |
| | | | 340/664 |
| 2012/0003863 A1* | 1/2012 | Sung | H04Q 1/136 |
| | | | 439/489 |
| 2017/0017598 A1* | 1/2017 | Chou | G06F 13/4022 |
| 2017/0293335 A1* | 10/2017 | Dunstan | G06F 1/266 |
| 2017/0364114 A1* | 12/2017 | Sporck | G05F 3/08 |
| 2018/0019587 A1* | 1/2018 | Chen | H02H 7/1213 |
| 2018/0034224 A1* | 2/2018 | Chung | G06F 13/4068 |
| 2018/0060201 A1* | 3/2018 | Newberry | G06F 1/3206 |
| 2018/0183340 A1* | 6/2018 | Waters | G06F 1/266 |
| 2019/0181590 A1* | 6/2019 | Bae | H01R 13/6683 |
| 2019/0220075 A1* | 7/2019 | Kim | G06F 1/10 |
| 2019/0312448 A1* | 10/2019 | Lim | G05F 3/02 |

* cited by examiner

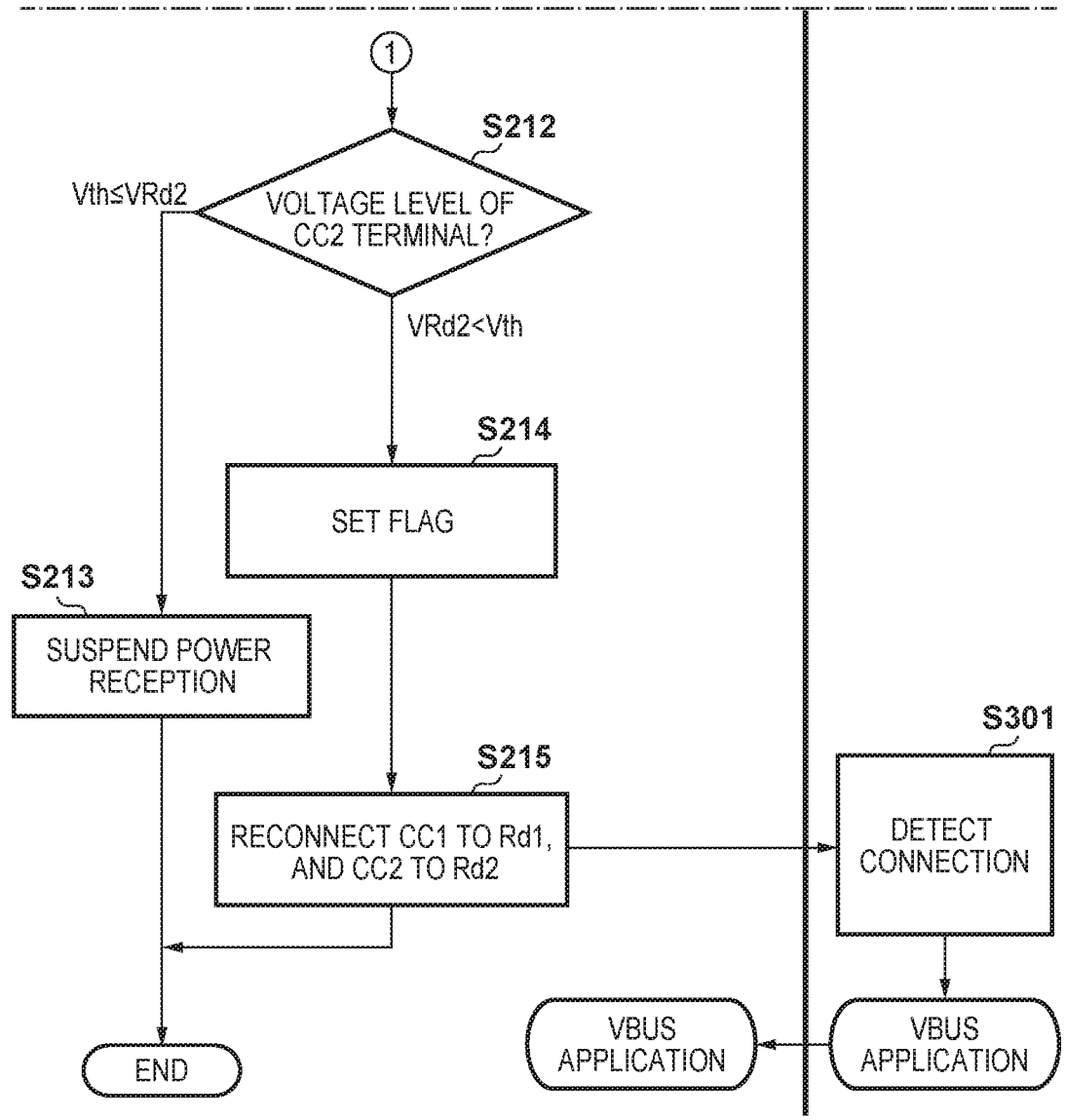

FIG. 6

| POWER TRANSMISSION APPARATUS | PULL-UP RESISTOR (WHEN CONNECTED TO 5 V) | CURRENT SOURCE | THRESHOLD VOLTAGE OF CC TERMINAL OF POWER RECEPTION APPARATUS |
|---|---|---|---|
| Default USB (0.5A@5V USB2.0) | 56kΩ | 80μA | 0.2V< |
| 1.5A@5V | 22kΩ | 180μA | 0.66V< |
| 3.0A@5V | 10kΩ | 330μA | 1.23V< |

ELECTRONIC DEVICE AND METHOD OF CONTROLLING THE SAME

BACKGROUND OF THE INVENTION

Field of the Invention

The present invention relates to an electronic device that receives power from an external device via an interface cable, and to a method of controlling the same.

Description of the Related Art

An electronic device provided with a Universal Serial Bus (USB) interface, such as a camera, can receive power from a USB host controller, an AC adapter, and other external devices via a USB cable. There are various USB specifications, including USB 2.0, USB 3.0, USB-BC, and USB-PD, and each of them prescribes receivable power. Regarding detection of current that can be used by an electronic device (detection of current that is can be supplied by an external device), a method of current detection by detecting, for example, a voltage level of a predetermined terminal of a USB interface has been suggested (Japanese Patent Laid-Open No. 6-141476).

In recent years, the USB specifications have been expanded to formulate the USB TYPE-C® (hereafter, 'USB Type-C') specification. The USB Type-C specification prescribes supply of 0.5-A, 1.5-A, and 3.0-A currents. Furthermore, according to the USB Type-C specification, supply of 3.0-A current requires a dedicated cable called an electronically marked cable (hereinafter abbreviated as EMC) to be connected as a USB interface cable. The USB Type-C specification adopts a method in which an external device presents notification of current that can be supplied by the external device to an electronic device via a configuration channel (hereinafter, "CC terminal"). Whether a cable is the dedicated cable (EMC) is determined by the external device. Therefore, the electronic device determines current with which power can be received based on information of the CC terminal presented by the external device.

However, for example, if a malfunction occurs in a currently used interface cable, there is a possibility that the information of the CC terminal presented by the external device indicates, for example, that 3.0-A current is suppliable even when the interface cable is not the EMC. In this case, if current with which power can be received is determined based solely on the information of the CC terminal presented by the external device, the electronic device will determine that it can receive power with current higher than or equal to current that can be supplied from the interface cable. As a result, the electronic device may receive power with current that exceeds the supply capability of the interface cable; this could possibly prevent stable reception of external power.

SUMMARY OF THE INVENTION

Embodiments of the present application disclose an electronic device that can receive a iarge amount of external power in a more stable manner by determining the power supply capability of a cable.

According to one aspect of the present invention, there is provided an electronic device that receives power from an external device when connected to the external device via a cable, the electronic device comprising: an interface unit that includes a first terminal and a second terminal, and is connectable to the cable; a detection unit that detects a power supply capability of the external device using the first terminal; a determination unit that determines whether the cable is a predetermined type of cable using the second terminal; and a setting unit that sets a limited current value based on the power supply capability of the external device detected by the detection unit and on a determination result obtained by the determination unit, the limited current value being an upper limit of a current value of the power.

According to another aspect of the present invention, there is provided a method of controlling an electronic device that includes a first terminal, a second terminal, and an interface unit connectable to a cable, and receives power when connected to an external device via the cable, the method comprising: detecting a power supply capability of the external device using the first terminal; determining whether the cable is a predetermined type of cable using the second terminal; and setting a limited current value of external power based on the detected power supply capability of the external device and on a determination result obtained in the determining.

According to still another aspect of the present invention, there is provided an electronic device that receives power from an external device when connected to an external device via a cable, the electronic device comprising: an interface unit that is connectable to the cable and composed of a first terminal for obtaining a power supply capability of the external device, a second terminal for determining a type of the cable, and a third terminal for receiving the power; and a control unit for controlling the power, wherein the control unit determines, via the first terminal, whether the power supply capability of the external device is a predetermined power supply capability upon establishment of connection between the interface unit and the external device via the cable, pulls up the second terminal when the power supply capability of the external device is the predetermined power supply capability, and starts receiving the power with a predetermined current value corresponding to the predetermined power supply capability from the external device using the third terminal when voltage of the second terminal is lower than a predetermined voltage.

Further features of the present invention will become apparent from the following description of exemplary embodiments (with reference to the attached drawings).

BRIEF DESCRIPTION OF THE DRAWINGS

FIGS. 4A and 4B are flowcharts for describing setting of a current value limit according to a second embodiment.

FIG. 6 shows a correspondence between the power supply capability of an external device and a threshold voltage of a CC terminal of an electronic device.

DESCRIPTION OF THE EMBODIMENTS

The following describes embodiments of the present invention with reference to the attached drawings. Note that the present invention is not limited to the following embodiments.

First Embodiment

Figure 1:
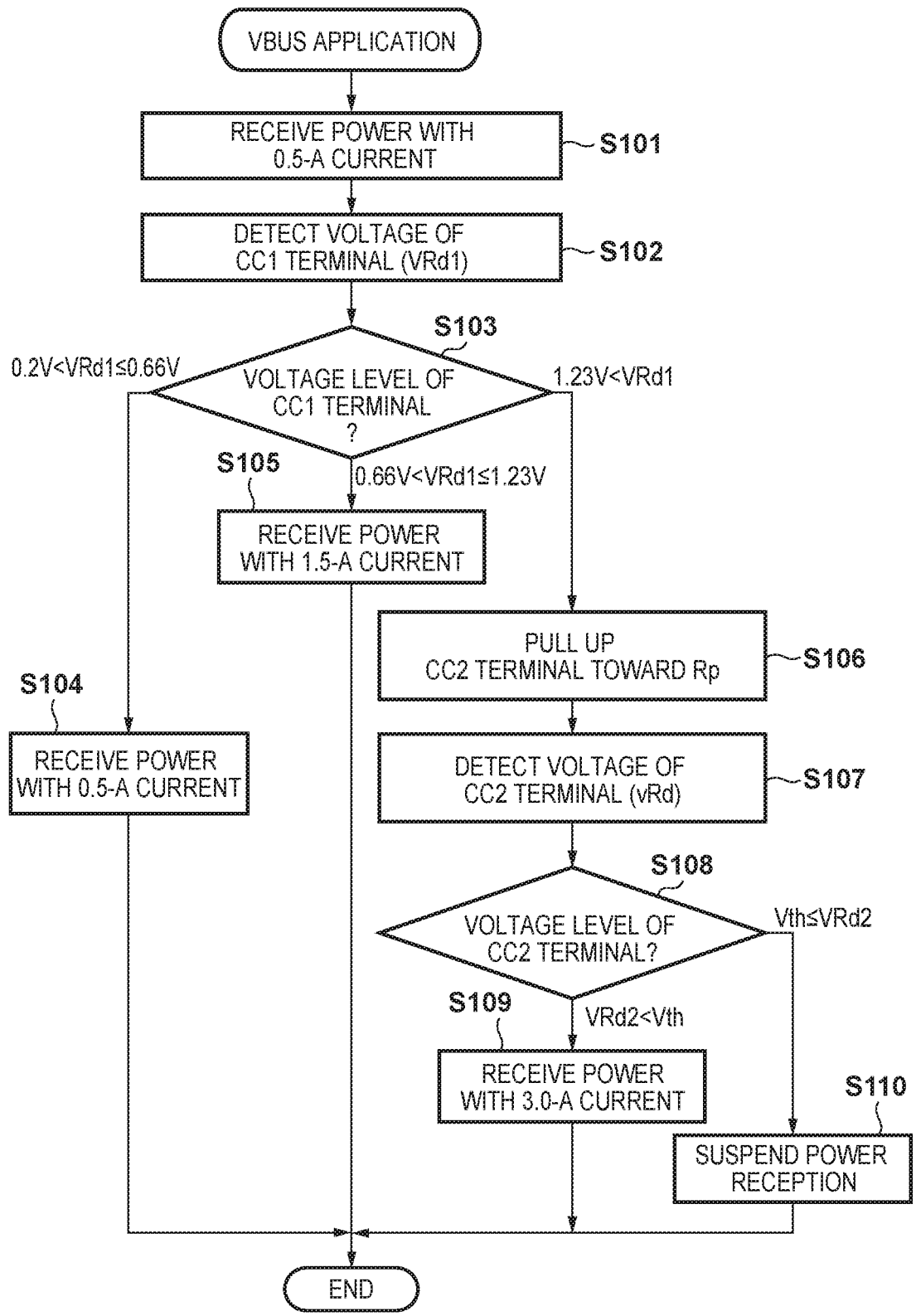
FIG. 1 is a flowchart for describing setting of a current value limit according to a first embodiment.
Figure 2:
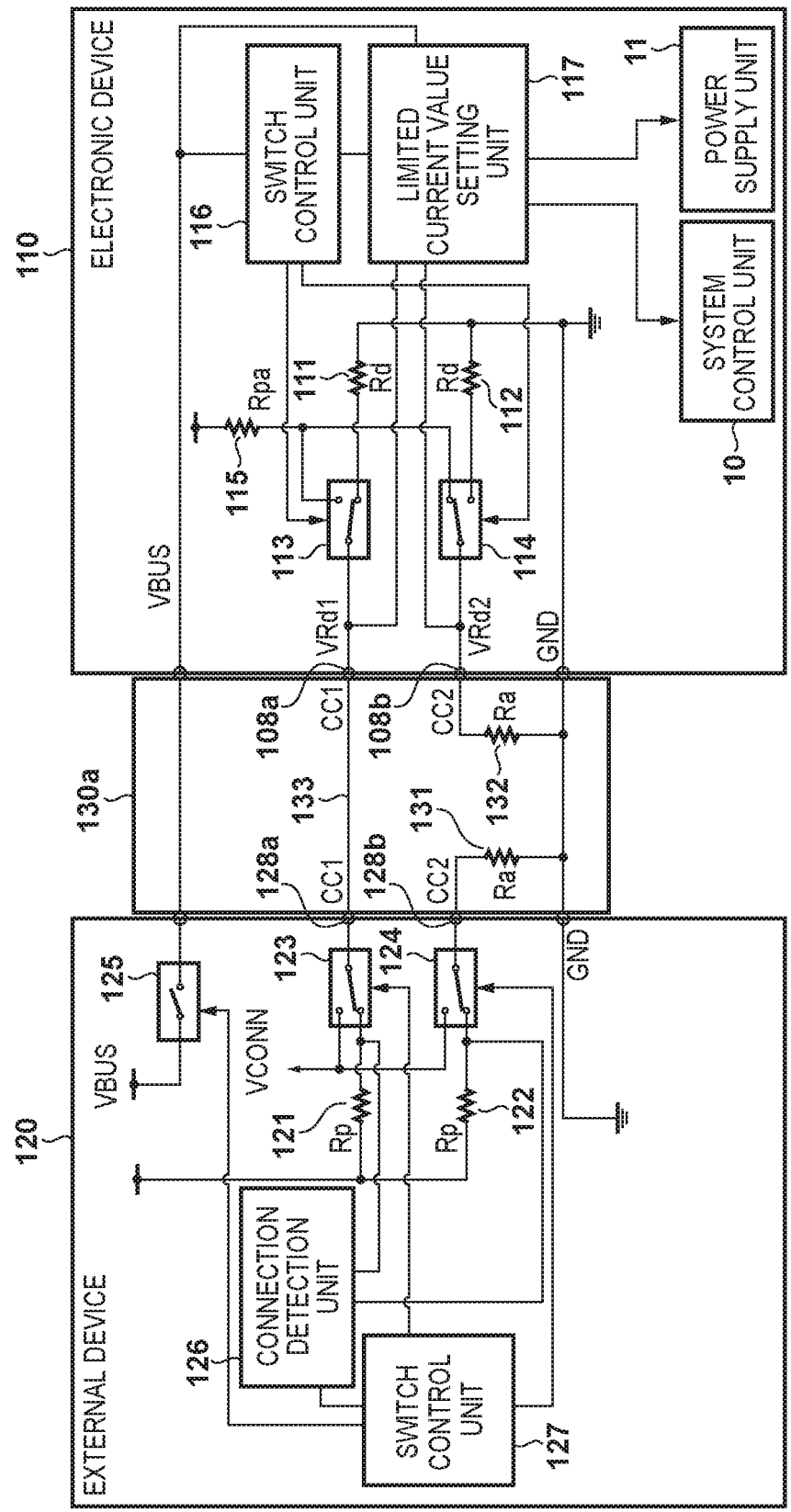
FIG. 2 is a block diagram showing exemplary configurations for deciding on the current value limit according to the first embodiment.
Figure 3:
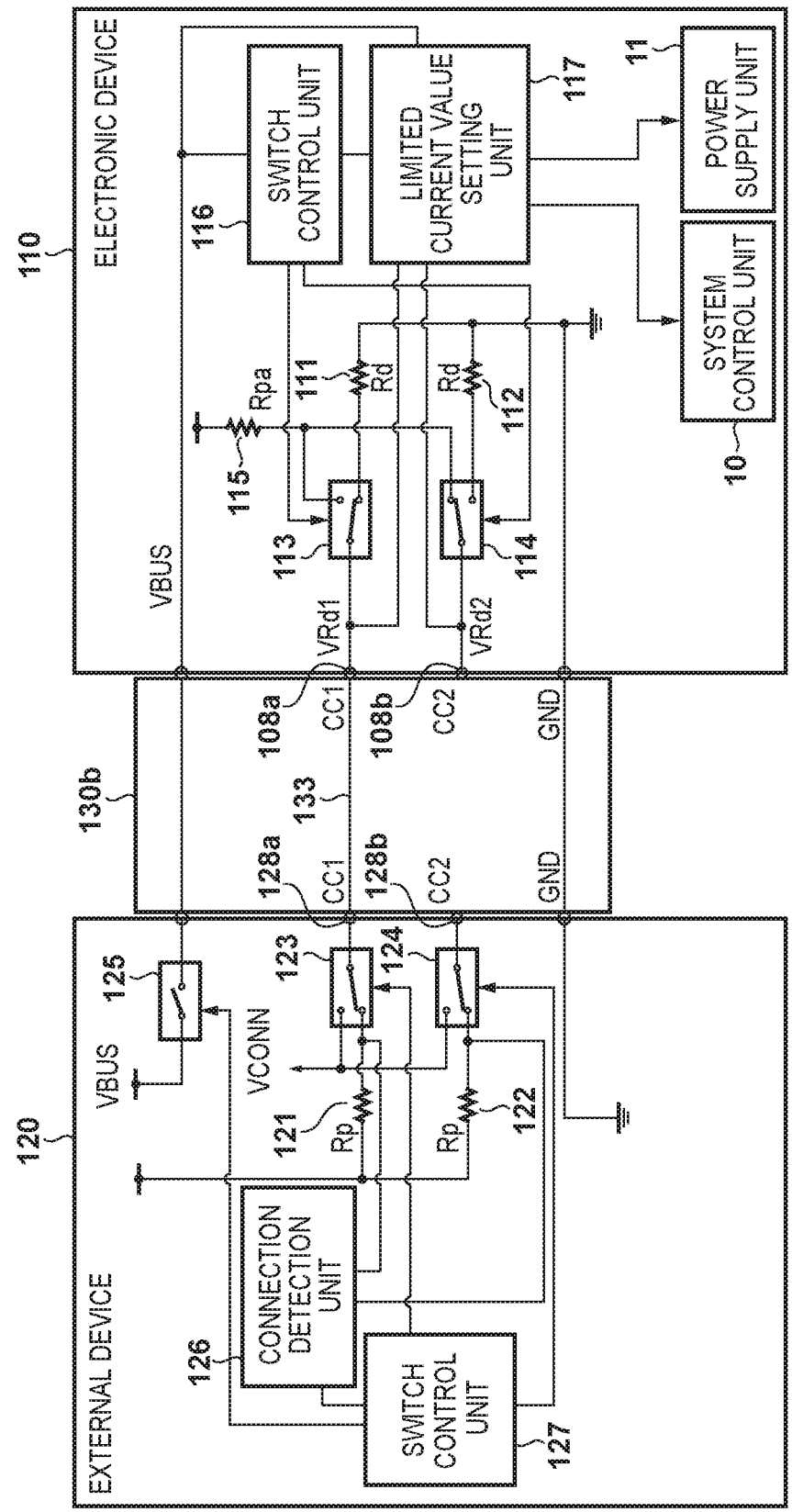
FIG. 3 is a block diagram showing exemplary configurations for deciding on the current value limit according to the first embodiment.

An electronic device according to the first embodiment will now be described with reference to FIGS. 1, 2, and 3. FIG. 1 is a flowchart of processing for deciding on current with which the electronic device receives power in the first embodiment. FIGS. 2 and 3 are block diagrams showing a state in which the electronic device and an external device according to the first embodiment, which respectively serve as a power reception apparatus and a power transmission apparatus, are connected via a cable (hereinafter, "interface cable"). The following description will be given under the assumption that the interfaces of the electronic device and the external device are compliant with the USB Type-C specification. Note that the specification of the interfaces that connect the electronic device and the external device is not limited to this.

The electronic device according to the present embodiment detects the power supply capability of the connected external device, and sets a current value limit based on the detected power supply capability of the external device. Setting the current value limit denotes processing for limiting a value of current that flows from the external device so as to limit received power when the electronic device receives power from the external device. That is to say, setting the current value limit denotes processing for setting an upper limit value of current that flows from the external device (a limited current value). The power supply capability of the external device is, for example, a supply current value indicating an upper limit value of current that can be supplied by the external device. The electronic device receives external power from the external device with current lower than or equal to the set limited current value. When a current value set as the limited current value is larger than a predetermined value (e.g., 3.0 A according to Type-C), the electronic device further uses the result of determining whether the cable is a predetermined type of cable (e.g., whether the cable is the EMC) as a setting criterion. By thus determining the power supply capability of the cable on an as-needed basis, a large amount of power can be received in a more stable manner. First, with reference to FIG. 2, a description is given of exemplary configurations of the electronic device, the external device, and the interface cable that connects them according to the present embodiment.

In FIG. 2, an electronic device 110 can receive external power via a USB interface. The electronic device 110 is, for example, a camera or a mobile telephone. An external device 120 can supply power via a USB interface.

The USB interface of the electronic device 110 includes a VBUS terminal for VBUS input, a CC1 terminal 108a and a CC2 terminal 108b that can be used as a configuration channel (CC), and a GND terminal for connection to GND via the connected external device. The electronic device 110 also includes a system control unit 10 and a power supply unit 11. The system control unit 10 has a CPU and a memory, and operates on at least one of external power obtained from the VBUS terminal and power from a battery (not illustrated). The system control unit 10 realizes various operations of the electronic device 110. The power supply unit 11 uses external power from the VBUS terminal under the set current value limit to supply power to various components of the electronic device 110 and to charge the battery.

The external device 120 is, for example, a USB host controller or an AC adapter of a PC and the like. The USB interface of the external device 120 includes a VBUS terminal for VBUS input, a CC1 terminal 128a and a CC2 terminal 128b that can be used as a configuration channel (CC), and a GND terminal for connection to GND via a connected external device. Note that the USB interfaces of the electronic device 110 and the external device 120 can also include terminals other than the aforementioned terminals.

Examples of the interface cable that connects the electronic device 110 and the external device 120 include a standard cable that can supply a current of 1.5 A or lower, and an electronically marked cable (EMC) that can supply a current of 3.0 A or higher. FIG. 2 shows a case in which the interface cable 130a is the EMC. In contrast, FIG. 3 shows a case in which the connected interface cable 130b is the standard cable that can supply a current of 1.5 A or lower. Below, the interface cables 130a, 130b may be collectively referred to as an interface cable 130.

In the electronic device 110, a pull-down resistor 111 is a resistor for pulling down the CC1 terminal 108a toward GND, and a pull-down resistor 112 is a resistor for pulling down the CC2 terminal 108b toward GND. The pull-down resistors 111 and 112 are used to determine whether the external device 120 and the electronic device 110 have been connected, and are also used by the electronic device 110 to determine the power supply capability of the external device 120. It will be assumed that the pull-down resistors 111 and 112 have a resistance value Rd that is prescribed in the USB Type-C specification (5.1 k$\Omega$). Note that according to the USB Type-C specification, a connector for connecting the interface cable and the electronic device is configured to be reversible when inserted. Therefore, both of the CC1 terminal 108a and the CC2 terminal 108b can be used as a CC terminal. In the electronic device 110, the CC1 terminal 108a and the CC2 terminal 108b are connected to the resistors of the same purpose (the pull-down resistors).

A changeover switch 113 switches a connection destination of the CC1 terminal 108a between the pull-down resistor 111 and a pull-up resistor 115 under control of a switch control unit 116. A changeover switch 114 switches a connection destination of the CC2 terminal 108b between the pull-down resistor 112 and the pull-up resistor 115 under control of the switch control unit 116. The pull-up resistor 115 is a resistor for pulling up the CC1 terminal 108a and the CC2 terminal 108b. It will be assumed that a resistance value Rpa of the pull-up resistor 115 is 56 k$\Omega$ in the present embodiment.

The switch control unit 116 controls the switching operations of the changeover switches 113 and 114 in accordance with an instruction from a limited current value setting unit 117. Upon establishment of connection between the electronic device 110 and the external device 120 via the interface cable 130, the switch control unit 116 controls the changeover switch 113 so as to connect the CC1 terminal 108a to the pull-down resistor 111. Furthermore, upon establishment of connection between the electronic device 110 and the external device 120 via the interface cable 130, the switch control unit 116 controls the changeover switch 114 so as to connect the CC2 terminal 108b to the pull-down resistor 111.

The limited current value setting unit 117 is a control circuit that controls the connection states of the CC1 terminal 108a and the CC2 terminal 108b, and decides on the limited current value in accordance with the voltage or the current of each terminal. Among the CC1 terminal 108a and the CC2 terminal 108b, the limited current value setting unit 117 uses a terminal from which voltage or current indicating the power supply capability of the external device 120 was obtained as a CC terminal, and uses the other terminal as a determination terminal used in cable determination. The limited current value setting unit 117 controls the first changeover switch 113 and the second changeover switch 114 so as to maintain a pulled-down state of the CC terminal and pull up the determination terminal.

For example, in the case of FIG. 2, the CC1 terminal 108a is the CC terminal, and the CC2 terminal 108b is the determination terminal. The switch control unit 116 controls the switching operation of the changeover switch 113 so as to pull down the CC1 terminal 108a that indicates the supply capability of the external device 120. On the other hand, the switch control unit 116 controls the switching operation of the changeover switch 114 so as to pull up the CC2 terminal 108b that serves as the determination terminal. The limited current value setting unit 117 detects the voltage levels of the CC1 terminal 108a and the CC2 terminal 108b, and sets the current value limit accordingly. In the connection example shown in FIG. 2, the limited current value setting unit 117 detects the power supply capability of the external device 120 based on the voltage VRd1 of the CC1 terminal 108a, and determines whether the interface cable 130 is the predetermined type of cable (the cable that can supply power with 3-A current) based on the voltage VRd2 of the CC2 terminal 108b. Although the changeover switch control unit 116 and the limited current value setting unit 117 operate on power that is supplied by the external device via VBUS in the present embodiment, no limitation is intended in this regard. For example, the battery (not illustrated) of the electronic device 110 may be used as a power source for the changeover switch control unit 116 and the limited current value setting unit 117.

A description will be given of the external device 120. In the external device 120, pull-up resistors 121 and 122 are used to present current that can be supplied by the external device 120 via the CC1 terminal 128a and the CC2 terminal 128b, respectively. FIG. 6 shows a correspondence between current that can be supplied by the external device and a resistance value Rp of the pull-up resistors 121, 122 as prescribed in the USB Type-C specification. For example, when the external device 120 can supply 1.5-A current, the resistance value Rp of the pull-up resistors 121, 122 is 22 kΩ. As stated earlier, according to the USB Type-C specification, a connector for USB connection is configured to be reversible when inserted; for this reason, the CC1 terminal 128a at the front surface and the CC2 terminal 128b at the back surface are connected to the pull-up resistors that are identical to each other. Note that current sources may be used is place of the pull-up resistors 121, 122. A correspondence between power (current) that can be supplied via the interface and a current value of the current sources is shown in FIG. 6.

A changeover switch 123 switches a connection destination of the CC1 terminal 128a between the pull-up resistor 121 and VCONN. A changeover switch 124 switches a connection destination of the CC2 terminal 128b between the pull-up resistor 122 and VCONN. Note that VCONN is a power source for internal circuits of the EMC. A changeover switch 125 switches between a state in which VBUS is output to the outside via the VBUS terminal and a state in which VBUS is not output to the outside via the VBUS terminal. A connection detection unit 126 detects establishment of connection to the electronic device 110 by monitoring the voltages of the CC1 terminal 128a and the CC2 terminal 128b. A switch control unit 127 controls the first changeover switch 123, the second changeover switch 124, and the third changeover switch 125 in accordance with the detection result concerning the electronic device 110 obtained by the connection detection unit 126.

A description is now given of the interface cable 130a. The interface cable 130a is the EMC. The interface cable 130a includes a VBUS line that connects the VBUS terminals of the connected devices, a line 133 that connects the CC terminals of the connected devices, and a GND line that connects the GND terminals of the connected devices. The interface cable 130a also includes determination lines connected to the CC1 or CC2 terminal(s) of the devices that is not connected to the line 133. The determination lines connect the terminals of the connected devices and the GND line via pull-down resistors. The interface cable 130a also includes pull-down resistors 131 and 132 that each have a resistance value Ra. The pull-down resistor 131 pulls down one of the CC1 terminal 128a and the CC2 terminal 128b of the external device 120 at one end of the interface cable 130a. The pull-down resistor 132 pulls down one of the CC1 terminal 108a and the CC2 terminal 108b of the electronic device 110 at the other end of the interface cable 130a. In the connection state shown in FIG. 2, the pull-down resistor 131 is connected between the CC2 terminal 128b of the external device 120 and GND, and pulls down the CC2 terminal 128b. The pull-down resistor 132 pulls down the CC2 terminal 108b of the electronic device 110. The USB Type-C specification prescribes that the resistance value Ra satisfies the relationship $800\Omega \leq Ra \leq 1.2\ k\Omega$. As the pull-down resistors 131 and 132 are respectively provided at the opposite ends of the cable, a connector of either side can be connected to the electronic device 110. When the electronic device 110 and the external device 120 are connected via the interface cable 130b that is not the EMC, the pull-down resistors 131 and 132 are not provided as shown in FIG. 3.

According to the USB Type-C specification, a connector for connecting the interface cable and the electronic device is configured to be reversible when inserted. The CC1 terminal 108a and the CC2 terminal 108b are provided at the front surface and the back surface of a connector of the electronic device 110, respectively. The CC1 terminal 128a and the CC2 terminal 128b are provided at the front surface and the back surface of a connector of the external device 120, respectively. Therefore, the line 133 can (a) connect the CC1 terminal 128a of the external device 120 and the CC1 terminal 108a of the electronic device 110 as shown in FIG. 2, (b) connect the CC2 terminal 128b of the external device 120 and the CC1 terminal 108a of the electronic device 110, (c) connect the CC1 terminal 128a of the external device 120 and the CC2 terminal 108b of the electronic device 110, and (d) connect the CC2 terminal 128b of the external device 120 and the CC2 terminal 108b of the electronic device 110. In the connection states of (a) and (b), the CC1 terminal 108a of the electronic device serves as the CC terminal of the electronic device 110. In the connection states of (c) and (d), the CC2 terminal 108b of the electronic device serves as the CC terminal of the electronic device 110.

Using the flowchart of FIG. 1, the following describes the operations of the electronic device 110 according to the first embodiment. When the external device 120 is connected to the electronic device 110 via the interface cable 130, first, the changeover switch 125 of the external device 120 is turned ON, and VBUS is applied to the electronic device 110. The electronic device 110 first receives external power supplied by the external device while limiting current to 0.5 A (step S101), thereby activating the changeover switch control unit 116 and the limited current value setting unit 117.

The switch control unit 116 causes both of the switches 113 and 114 to switch to the pull-down side. In this state, the limited current value setting unit 117 detects the power supply capability of the external device 120 based on the voltage of a terminal from which the voltage has been detected among the CC1 terminal 108a and the CC2 terminal 108b. It will be assumed that the voltage has been detected from the CC1 terminal 108a as shown in FIG. 2 in the present embodiment. The limited current value setting unit 117 detects the voltage of the CC1 terminal 108a (VRd1) as a signal indicating the power supply capability (step S102). Although the voltage is detected from the CC1 terminal 108a in the present case, there is a case in which the voltage (VRd2) is detected from the CC2 terminal 108b because a connector is configured to be reversible as stated earlier. Furthermore, the pull-up resistor 121 or 122 of the external device 120 can be connected to both of the CC1 terminal 108a and the CC2 terminal 108b. For ease of explanation, FIG. 2 shows a case in which the pull-up resistor 121 of the external device 120 is connected to the CC1 terminal 108a.

Next, the limited current value setting unit 117 decides on a limit on a current value of received power (the limited current value) by comparing the level of the obtained voltage of the CC1 terminal 108a (VRd1) with thresholds (step S103). In the present embodiment, the power supply capability of the external device 120 is detected based on the level of the voltage of the CC1 terminal 108a (see FIG. 6). When the power supply capability is not a predetermined capability, the limited current value setting unit 117 sets the current value limit based on the power supply capability that was detected based on the level of the voltage of the CC1 terminal 108a (steps S104, S105). On the other hand, when the power supply capability that was detected based on the voltage level of the CC1 terminal 108a is the predetermined capability, the determination result concerning a cable type is used in setting the current value limit (steps S106 to S109).

When the relationship $0.2\ V < VRd1 \le 0.66\ V$ is satisfied in step S103, the current of external power received by the electronic device 110 is limited to 0.5 A (step S104). When the relationship $0.66\ V < VRd1 \le 1.23\ V$ is satisfied in step S103, the current of external power received by the electronic device 110 is limited to 1.5 A (step S105). When the relationship $1.23\ V < VRd1$ is satisfied in step S103, the external device 120 is capable of supplying power with 3.0-A current. In this case, the processes of steps S106 to S108 are executed to use the result of determining whether the cable is the predetermined type of cable (in the present embodiment, whether the cable is the EMC) as a criterion for setting the current value limit. First, in accordance with an instruction from the limited current value setting unit 117, the changeover switch control unit 116 causes the changeover switch 114 to switch its connection destination from the pull-down resistor 112 to the pull-up resistor 115 (step S106). As a result, the CC2 terminal 108b is pulled up. Thereafter, the limited current value setting unit 117 detects the voltage of the CC2 terminal 108b (VRd2) (step S107).

The limited current value setting unit 117 compares the level of the voltage of the CC2 terminal 108b (VRd2) with a threshold Vth (step S108). When the relationship VRd2<Vth is satisfied, the limited current value setting unit 117 determines that the connected interface cable 130 is the EMC, and sets the current value limit so that the electronic device 110 starts receiving power with 3.0-A current (step S109). Note that VRd2 is a voltage determined by the resistance value Rpa of the pull-up resistor 115 and the resistance value Ra of the pull-down resistor 132 of the interface cable 130a. Provided that the pull-up resistor 115 is connected to a 5-V power source, the resistance value Rpa is 56 kΩ, and the resistance value Ra of the pull-down resistor 132 of the interface cable 130a is 1 kΩ, the following relationship is satisfied: VRd2=5 V×1/(56+1)≈0.09 V. Therefore, for example, provided that Vth is 0.2 V, the interface cable 130a is determined to be the EMC when the relationship VRd2<0.2 V is satisfied.

On the other hand, when the interface cable 130b (non-EMC) is connected as shown in FIG. 3, the CC2 terminal 108b is open, and VRd2 is a pull-up voltage (e.g., 5 V). In this case, the relationship 0.2 V≤VRd2 is satisfied, and the interface cable 130b is not determined to be the EMC. When the voltage of the CC2 terminal 108b satisfies the relationship VRd2≥Vth, although the limited current value setting unit 117 determines that power can be received with 3.0-A current based on the information obtained from the CC1 terminal 108a, it determines that the interface cable is not capable of supplying 3.0-A current and suspends power reception (step S110). In this case, power reception may be continued by setting 0.5 A as the current value limit similarly to step S104. Alternatively, power reception may be continued by setting 1.5 A as the current value limit similarly to step S105.

As described above, the electronic device 110 according to the first embodiment limits a current value of received external power by detecting the supply capability of the interface cable. Specifically, the electronic device 110 determines whether the interface cable can transmit power in accordance with a current value corresponding to the power supply capability of the external device 120, and limits a current value of external power based on the determination result. Therefore, even if it is determined that 3.0-A current can be supplied due to obtainment of erroneous information about the CC terminal caused by disconnection of the interface cable, noise, and the like, detection of the supply capability of the interface cable makes it possible to determine that power reception with such current cannot be performed and suspend power reception. As a result, charging can be performed with a large amount of power in a more stable manner.

Second Embodiment

Figure 4A:
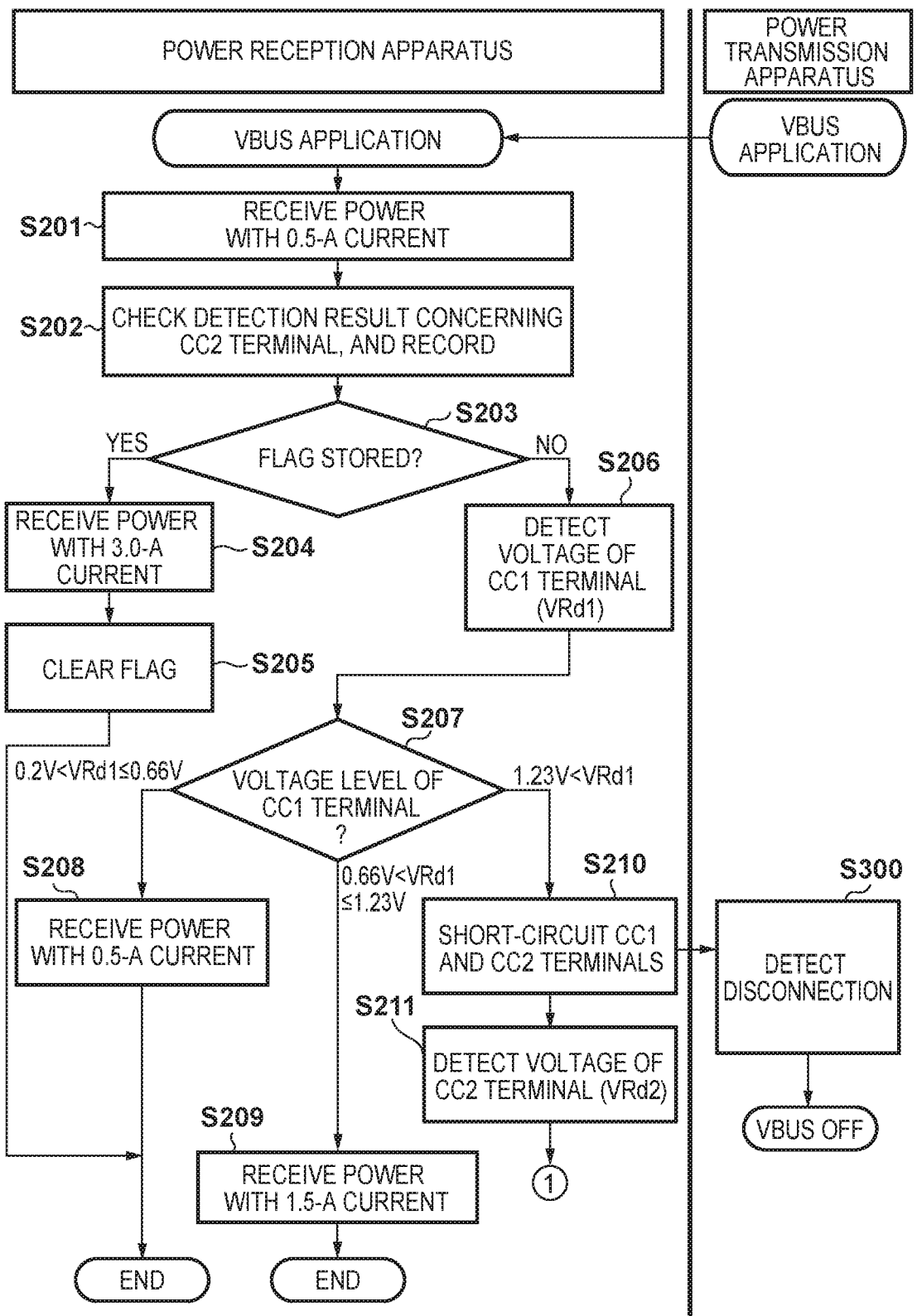
Figure 5:
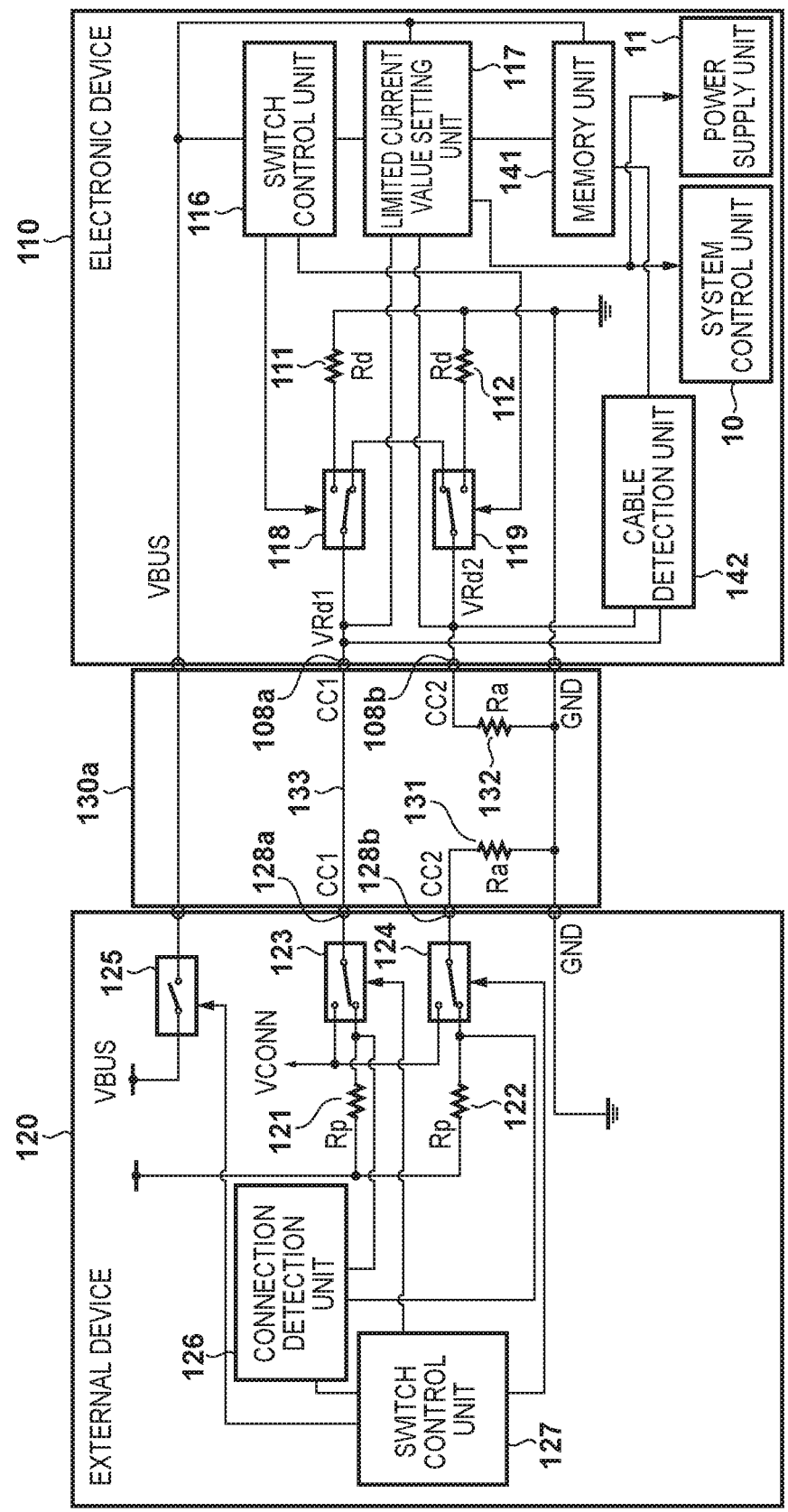
FIG. 5 is a block diagram showing exemplary configurations for deciding on the current value limit according to the second embodiment.

An electronic device according to a second embodiment will now be described with reference to FIGS. 4A to 5. FIGS. 4A and 4B are flowcharts for describing the second embodiment. FIG. 5 is a block diagram showing a state in which an electronic device 110 and an external device 120 according to the second embodiment are connected via an interface cable. Note that the components shown in FIG. 5 that are similar to those shown in FIG. 2 are given the same reference signs thereto.

FIG. 5 is different from the first embodiment (FIG. 2) mainly in a changeover switch 118, a changeover switch 119, a memory unit 141, and a cable detection unit 142. The changeover switch 118 switches a connection destination of a CC1 terminal 108a between a pull-down resistor 111 and one end of the changeover switch 119. The changeover switch 119 switches a connection destination of a CC2 terminal 108b between a pull-down resistor 112 and one end of the changeover switch 118.

The memory unit 141 stores therein information indicating whether the cable connecting the external device 120 and the electronic device 110 is the EMC. One bit of a memory or a similar recording device that is used for the operations of the electronic device 110 can be used as the memory unit 141. As will be described later, the memory unit 141 maintains information therein even when supply of external power from the external device 120 (VBUS) has been suspended. It is thus desirable that the memory unit 141 be constituted by a nonvolatile memory. Alternatively, the memory unit 141 may be configured to maintain the state in which information is stored therein only for a predetermined period after suspension of external power with the aid of, for example, a capacitor that stores external power, or may be configured to operate with the aid of a non-illustrated battery of the electronic device 110.

The cable detection unit 142 detects the insertion and removal of the interface cable 130, and resets (deletes) information stored in the memory unit 141 (information indicating that connection with the EMC has been established) upon removal of the interface cable 130. As the cable detection unit 142 changes information in the memory unit 141 upon detection of a state in which the interface cable 130 has been removed, it is desirable that it operate with the aid of the non-illustrated battery of the electronic device, rather than external power from the external device 120 (VBUS). It may be configured to be able to maintain its operations only for a predetermined period after suspension of external power with the aid of, for example, a capacitor that stores external power. Note that a limited current value setting unit 117 is configured to be able to maintain its operations for a predetermined period after suspension of external power with the aid of, for example, a capacitor that stores external power. Although FIG. 5 shows a switch control unit 116 and the limited current value setting unit 117 that are configured to operate on VBUS power from the external device 120, no limitation is intended in this regard. For example, the battery of the electronic device 110 may be used as a power source for the switch control unit 116 and the limited current value setting unit 117.

In the second embodiment, the memory unit 141 is additionally provided in contrast to the first embodiment. However, it is sufficient for the memory unit 141 to store one-bit information indicating whether connection with the EMC has been established; for example, one bit of a memory or a similar recording device that is necessary for the operations of the electronic device 110 can be used. The system control unit 10 may be configured to realize the functions of the cable detection unit 142. In this case, an increase in the number of provided devices is practically prevented. Therefore, the configurations according to the second embodiment can eliminate the pull-up resistor 115, thereby reducing the number of components.

Using the flowcharts of FIGS. 4A and 4B, the following describes processing for setting a current value limit in the second embodiment. When the external device 120 is connected to the electronic device 110 via the interface cable 130, first, a third changeover switch 125 of the external device 120 is turned ON, and VBUS is applied to the electronic device 110. Then, the electronic device 110 receives power with 0.5-A current (step S201). This enables the switch control unit 116 and the limited current value setting unit 117 to operate. Note that the limited current value setting unit 117 instructs the switch control unit 116 to pull down both of the CC1 terminal and the CC2 terminal.

Next, the limited current value setting unit 117 determines whether the memory unit 141 stores therein a record (flag) indicating that the EMC capable of supplying 3.0-A current has been detected (step S202). If the flag indicating that the EMC capable of supplying 3.0-A current has been detected (hereinafter, "EMC flag") is ON in the memory unit 141, the electronic device 110 starts receiving power with 3.0-A current (step S204). Then, the electronic device 110 clears the EMS flag in the memory unit 141 (step S205). Note that the EMC flag is set in later-described step S214 when the external device 120 is capable of supplying power with 3.0-A current and the detection result indicates that the interface cable 130 is the EMC.

If the EMC flag is not set in step S203, the limited current value setting unit 117 detects voltage or current indicating the power supply capability from one of the two terminals (step S206). In the present embodiment, the voltage indicating the power supply capability is detected from the CC1 terminal 108a shown in FIG. 5. Similarly to the first embodiment, there is a case in which the voltage indicating the power supply capability is detected from the CC2 terminal 108b shown in FIG. 5 as a connector is configured to be reversible. Furthermore, a pull-up resistor 121 or 122 of the external device 120 can be connected to both of the CC1 terminal 108a and the CC2 terminal 108b. For ease of explanation, the figure shows a case in which the pull-up resistor 121 of the external device 120 is connected to the CC1 terminal 108a.

The limited current value setting unit 117 compares the voltage level of the CC1 terminal 108a (VRd1) with thresholds (step S207). When the relationship $0.2\ V < vRd1 \leq 0.66\ V$ is satisfied, the electronic device 110 sets 0.5 A as the current value limit, and receives external power (step S208). When the relationship $0.66\ V < VRd1 \leq 1.23\ V$ is satisfied, the electronic device 110 sets 1.5 A as the current value limit, and receives external power (step S209). When the relationship $1.23\ V < VRd1$ is satisfied, the external device 120 is capable of supplying power with 3.0-A current. In this case, the processes of steps S210 to S214 are executed to use the result of determining whether the cable is a predetermined type of cable (in the present embodiment, whether the cable is the EMC) as a criterion for setting the current value limit.

The limited current value setting unit 117 sets the switch control unit 116 so that the changeover switches 118 and 119 perform a switching operation to short-circuit the CC1 terminal 108a and the CC2 terminal 108b (step S210). This switching operation cuts off connection between the CC1 terminal 108a and the pull-down resistor 111, and connection between the CC2 terminal 108b and the pull-down resistor 112. Then, the limited current value setting unit 117 detects the voltage of the CC2 terminal 108b (VRd2) (step S211).

As a result of short-circuiting the CC1 terminal 108a and the CC2 terminal 108b, a pull-down resistance value of the CC1 terminal 108a changes from Rd to Ra. Upon detecting the change in the pull-down resistance value of the CC1 terminal 108a, the external device 120 suspends power supply to VBUS. Therefore, there is a possibility that the processes of later-described steps S212 to S215 are executed in a state in which power supply from VBUS has been suspended. As described above, the switch control unit 116, the limited current value setting unit 117, the memory unit 141, and the cable detection unit 142 can operate at least for a predetermined period from the time of suspension of external power from VBUS; this enables execution of steps S211 to S215.

When the relationship $Vth \leq VRd$ is satisfied (step S212), the interface cable is not determined to be the EMC, power reception is suspended. (step S213), and the present processing is ended. Thus, even if it is determined that power can be received with 3.0-A current based on the information obtained from the CC1 terminal 108a, power reception is suspended if it is determined that the interface cable is not capable of supplying 3.0-A current.

If the voltage level of the CC2 terminal 108b detected by the limited current value setting unit 117 satisfies the relationship VRd2<Vth (step S212), the interface cable is determined to be the EMC. Note that VRd2 is a voltage determined by a pull-up resistor Rpa and a pull-down resistor Ra of the interface cable. Provided that Rpa is connected to a 5-V power source, Rpa is 56 kΩ, and the pull-down resistor Ra of the interface cable is 1 kΩ, the following relationship is satisfied: VRd2=5 V×1/(56+1)≈0.09 V. For example, provided that Vth is 0.2 V, the connected cable is determined to be the EMC when the relationship VRd2<0.2 V is satisfied. When the connected cable is the non-EMC, the CC2 terminal is open, and the relationship 0.2 V≤VRd2 is satisfied.

If the interface cable 130 is determined to be the EMC, the limited current value setting unit 117 sets the EMC flag indicating that the EMC capable of supplying 3.0-A current has been detected (step S214). Thereafter, the switch control unit 116 connects the CC1 terminal 108a and the CC2 terminal 108b to the first pull-down resistor 111 and the second pull-down resistor 112, respectively, by controlling the first changeover switch 118 and the second changeover switch 119 (step S215), and then ends the present processing. As a result, the CC1 terminal 108a is connected to the first pull-down resistor 111, a connection detection unit 126 of the external device 120 determines that the interface cable has been connected (step S301), and VBUS is applied again. The limited current value setting unit 117 is reactivated in accordance with the start of supply of external power from VBUS, and restarts the present processing from step S201. In this case, as the limited current value setting unit 117 detects the presence of the EMC flag in the memory unit 141 (YES of step S203), it sets the current value limit to start power reception with 3.0-A current (step S204).

Upon insertion or removal of the cable, it is necessary to detect the property of the cable again. For this reason, the cable detection unit 142 detects the insertion and removal of the cable, and clears the flag that was recorded in the memory unit 141 in step S214 upon detection of the removal of the cable. Although the insertion and removal of the cable is detected using the cable detection unit 142, the insertion and removal of the cable can be detected using the limited current value setting unit 117 instead if a function similar to such detection can be realized by detecting the voltage of the CC1 terminal 108a using the limited current value setting unit 117.

Although power reception remains in a suspended state when the interface cable is not the EMC in the foregoing processing, no limitation is intended in this regard. For example, when the interface cable is not the EMC, power reception with 0.5-A or 1.5-A current may be set. In this case, the limited current value setting unit 117 causes the memory unit 141 to retain the determination result indicating that the cable is not the EMC (hereinafter, "non-EMC flag") in step S213, and thereafter, the CC1 terminal 108a and the CC2 terminal 108b are connected to the pull-down resistors 111, 112 in step S215. Then, when the limited current value setting unit 117 has restarted the present processing from step S201 upon reapplication of external power, power is received with 0.5-A current upon detection of the non-EMC flag in step S203. In this way, if it is determined that power can be received with 3.0-A current based on the information obtained from the CC1 terminal 108a but the cable is not determined to be the EMC, power reception can be continued with 0.5-A current. Alternatively, if the non-EMC flag is detected in step S203, power reception with 1.5-A current may be set in step S209.

As described above, similarly to the first embodiment, the second embodiment can determine the supply capability of the interface cable, and suspend power reception if it is determined that power cannot be received with 3.0-A current. Furthermore, the second embodiment does not require the pull-up resistor 115, thereby realizing stable reception of external power with a smaller number of components than the first embodiment.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-173124, filed Sep. 5, 2016, which is hereby incorporated by reference herein in its entirety.

What is claimed is:

1. An electronic device that receives power from an external device when connected to the external device via a cable, the electronic device comprising:
an interface circuit having a first terminal, a second terminal and a third terminal that is different from the first terminal and the second terminal and through which the power is received from the external device, the interface circuit configured to connect to the cable;
a detection circuit configured to detect a power supply capability of the external device using the first terminal;

a determination circuit configured to determine whether the cable is a predetermined type of cable using the second terminal; and a setting circuit configured to set a limited current value based on the power supply capability of the external device detected by the detection circuit and a determination result obtained by the determination circuit, the limited current value being an upper limit of a current value of the power.

2. The electronic device according to claim 1, wherein the power supply capability of the external device is a supply current value indicating an upper limit value of current that is suppliable from the external device, and the setting circuit sets the supply current value as the limited current value when the cable is the predetermined type of cable.

3. The electronic device according to claim 2, wherein The determination circuit determines whether the cable is the predetermined type of cable when the supply current value is larger than a predetermined value, and the predetermined type of cable is capable of supplying the power of the supply current value larger than the predetermined value from the external device to the electronic device.

4. The electronic device according to claim 1, wherein the predetermined type of cable is an electronically marked cable.

5. The electronic device according to claim 1, wherein The detection circuit detects the power supply capability of the external device based on at least one of voltage and current of the first terminal, and the determination circuit determines whether the cable is the predetermined type of cable based on at least one of voltage and current of the second terminal.

6. The electronic device according to claim 1, wherein The detection circuit detects the power supply capability of the external device based on voltage or current of the first terminal in a state in which the first terminal has been pulled down via a predetermined resistance value.

7. The electronic device according to claim 1, wherein The determination circuit determines whether the cable is the predetermined type of cable based on voltage or current of the second terminal in a state in which the second terminal has been pulled up via a predetermined resistance value.

8. The electronic device according to claim 1, wherein the determination circuit determines whether the cable is the predetermined type of cable based on voltage or current of the second terminal obtained in a state in which the first terminal and the second terminal have been short-circuited.

9. The electronic device according to claim 1, wherein the detection circuit detects the power supply capability of the external device based on voltage or current of one of the first terminal and the second terminal in a first connection state in which both of the first terminal and the second terminal have been pulled down, and the determination circuit determines whether the cable is the predetermined type of cable based on voltage or current of one of the first terminal and the second terminal in a second connection state in which the first terminal and the second terminal have been short-circuited.

10. The electronic device according to claim 9, further comprising
a changeover unit that switches between the first connection state and the second connection state.

11. The electronic device according to claim 10, further comprising:
a memory unit that stores therein information indicating that setting of a predetermined current value as the limited current value has been decided on based on the power supply capability of the external device detected by the detection circuit and on the determination result obtained by the determination circuit, wherein
when connected to the cable, the interface circuit of the electronic device suspends supply of external power when the changeover unit has switched to the second connection state,
after the supply of the external power has been suspended, the memory unit maintains a state in which the information is stored therein for at least a predetermined period, and
the setting circuit is activated when the supply of the external power is restarted upon return to the first connection state, and sets the predetermined current value as the limited current value when the information is stored in the memory unit.

12. The electronic device according to claim 1, further comprising:
a memory unit that stores therein information indicating that setting of a predetermined current value as the limited current value has been decided on based on the power supply capability of the external device detected by the detection circuit and on the determination result obtained by the determination circuit, wherein
the setting circuit sets the predetermined current value as the limited current value when the information is stored in the memory unit.

13. The electronic device according to claim 12, wherein the memory unit deletes the information when connection between the cable and the interface circuit is cut off.

14. The electronic device according to claim 1, further comprising
a power reception circuit that receives the power from the external device, wherein
the power reception circuit receives the power from the external device with a current lower than or equal to the limited current value set by the setting circuit.

15. A method of controlling an electronic device that includes a first terminal, a second terminal, a third terminal that is different from the first terminal and the second terminal and through which power is received from an external device, and an interface circuit connectable to a cable that receives the power when connected to the external device via the cable, the method comprising:
detecting a power supply capability of the external device using the first terminal;
determining whether the cable is a predetermined type of cable using the second terminal; and
setting a limited current value of the power based on the detected power supply capability of the external device and on a determination result obtained in the determining.

16. An electronic device that receives power from an external device when connected to the external device via a cable, the electronic device comprising:
an interface circuit that is connectable to the cable and composed of
a first terminal for obtaining a power supply capability of the external device,
a second terminal for determining a type of the cable, and
a third terminal for receiving the power; and
a control circuit for controlling the power, wherein the control circuit determines, via the first terminal, whether the power supply capability of the external device is a predetermined power supply capability upon establishment of connection between the interface circuit and the external device via the cable, pulls up the second terminal when the power supply capability of the external device is the predetermined power supply capability, and starts receiving the power with a predetermined current value corresponding to the predetermined power supply capability from the external device using the third terminal when voltage of the second terminal is lower than a predetermined voltage.

* * * * *